United States Patent [19]

Bunshah et al.

[11] Patent Number: 4,767,666
[45] Date of Patent: Aug. 30, 1988

[54] WAFER BASE FOR SILICON CARBIDE SEMICONDUCTOR DEVICE

[75] Inventors: Rointan F. Bunshah, Playa Del Rey; James D. Parsons, Newbury Park; Oscar M. Stafsudd, Los Angeles, all of Calif.

[73] Assignee: The Regents of the University of California, Berkeley, Calif.

[21] Appl. No.: 737,367

[22] Filed: May 23, 1985

[51] Int. Cl.$^4$ .......................... B32B 7/02; B32B 15/04
[52] U.S. Cl. .................................. 428/334; 428/446; 428/698; 428/700
[58] Field of Search ................. 428/334, 446, 698, 700

[56] References Cited

U.S. PATENT DOCUMENTS 4,525,415  6/1985  Porat .................................. 428/698

Primary Examiner—Marion C. McCamish
Attorney, Agent, or Firm—Harris, Kern, Wallen & Tinsley

[57] ABSTRACT

A semiconductor device wafer base wherein devices may be fabricated in silicon carbide, the base having a compatible substrate and a beta silicon carbide overlay layer epitaxially related to the substrate, the beta silicon carbide layer being unpolytyped, single crystal, uncracked, without twins, and having integrated circuit quality surface morphology. Preferably, the substrate is a single crystal of titanium carbide, which is the same cubic lattice-type as beta silicon carbide with a lattice parameter different from that of beta silicon carbide by less than about 1%. Additionally, the thermal expansion coefficients of beta silicon carbide and titanium carbide are nearly the same, minimizing the creation of thermal stresses during cooling and heating. The beta silicon carbide is useful in fabricating semiconductor devices for use at much higher temperatures than is silicon, and for use at high power levels, at high frequencies, and in radiation hardened applications. The device base may be fabricated by any suitable technique, including reactive deposition and chemical vapor deposition.

8 Claims, 2 Drawing Sheets

WAFER BASE FOR SILICON CARBIDE SEMICONDUCTOR DEVICE

BACKGROUND OF THE INVENTION

This invention relates generally to the fabrication of semiconductor devices, and more particularly, to a semiconductor device wafer base wherein a silicon carbide overlay layer is deposited on a suitable substrate.

An extensive technology of semiconductor devices has been developed based upon the properties of single crystal silicon and other similar materials which may be doped, heat treated and otherwise processed to produce adjacent layers and regions of varying electronic characteristics. The use of devices produced by silicon technology is generally limited to operation at ambient or, at most, low elevated temperatures, and in non-corrosive, inert environments. The temperature limitation is a consequence of the rapid diffusion of dopant and impurity species in the silicon, which in turn can substantially alter the character of the fabricated semiconductor device by diffusional degradation. The limitation to relatively inert environments results from the high chemical reactivity of silicon in many corrosive environments, which also can alter the character of the fabricated device. Silicon devices are also limited as to power level, frequency and radiation tolerance by the materials used therein.

For many applications, the temperature, environmental, and other use limitations on silicon devices may be overcome by the use of proper cooling and packaging techniques, but in other applications these limitations have prevented the use of silicon for integrated circuit technology. For example, in many space craft and aircraft applications, elevated temperatures may be encountered, and it is not always possible to insure that adequate cooling is provided. In high power applications, internal thermal transients in devices otherwise operating at ambient temperature can rapidly destroy the operability of the device unless extensive cooling is provided. Such cooling requires that the device be larger in size than might otherwise be necessary, in part defeating the purpose of the integrated circuit technology.

There has therefore been an on-going search over a period of twenty years to identify and develop a semiconductor technology based in other materials which allow the fabrication of devices for use at higher temperatures such as, for example, the range of at least about 400° C.–600° C., and in applications not amenable to the use of silicon. Because corrosive effects can be greatly accelerated at elevated temperatures, any such materials and devices must also exhibit excellent corrosion resistance over a range of pressures from vacuum to many atmospheres. Some generally desirable requirements of such materials have been identified, including large band gap, ability to be doped to produce regions of varying electronic characteristics, a high melting temperature, resistance to diffusion by undesired foreign atoms, thermal stability, chemical inertness, and the ability to form ohmic external contacts.

Silicon carbide was early identified as a candidate material meeting the indicated requirements. Silicon carbide has a high breakdown voltage, a relatively large band gap, and a thermal conductivity of more than three times that of silicon at ambient temperature. Silicon carbide is also resistant to the diffusion of impurity species. Silicon carbide may be processed by several techniques similar to those used in silicon device technology, and in many instances silicon carbide devices may be substituted at moderate and low temperatures for silicon devices. Silicon carbide semiconductor device technology therefore offers the opportunity for supplementing, and in some instances replacing, conventional silicon device technology.

For all of its potential, the promise of silicon carbide device technology has not been achieved simply because it has not been possible to produce unpolytyped silicon carbide single crystals of sufficient size to allow the fabrication of semiconductor devices. Small bulk single crystals of beta silicon carbide have been fabricated, but with dimensions no greater than about 2 millimeters. An alternative approach to the use of bulk single crystals, which is widely used in silicon device technology, is the preparation of device bases by epitaxially depositing an overlay of the desired semiconductor on a substrate which serves both to support the overlay layer and to provide a nucleation plane for epitaxial growth. Epitaxial growth of thin overlay layers of beta silicon carbide has been attempted on beta silicon carbide itself, previously carburized silicon, alpha silicon carbide and molybdenum with and without a liquid metal intermediate layer, and silicon.

All of these substrates and techniques have proved to be unsuitable, either because large single crystals of the substrates themselves cannot be prepared, because the resulting silicon carbide overlays could not be fabricated as sufficiently large single crystals, because a single stable crystal of beta silicon carbide polytype without any included alpha silicon carbide polytype could not be prepared, because of a large lattice parameter and thermal expansion mismatch between the beta silicon carbide and the substrate, or because of unsatisfactory surface morphology of the resulting beta silicon carbide overlay. In short, an intensive, worldwide effort to produce either bulk single crystals or epitaxial overlay single crystals of unpolytyped silicon carbide suitable for integrated circuit applications, with dimensions greater that a few millimeters, has failed completely. The potential for the use of silicon carbide has been verified by manufacturing devices in very small silicon carbide crystals, but this demonstration has not been extended to practical, large scale devices because of this limitation in fabricating sufficiently large single crystals of a single polytype or large area beta silicon carbide epitaxial layers suitable for device or integrated circuit processing.

Thus, there exists a need for some approach to utilizing silicon carbide semiconductor technology on a large scale in practical devices. The approach should allow the reproducible preparation of thin beta silicon carbide single crystals having lateral dimensions greater than several millimeters, so that large scale semiconductor arrays of devices can be processed and prepared on a single crystal. The approach should also be consistent with the utilization of the desirable characteristics of beta silicon carbide. That is, the fabrication technique should not adversely influence its thermal stability, corrosion resistance, and other desirable properties. The present invention fulfills this need, and further provides related advantages.

SUMMARY OF THE INVENTION

There is provided a thin film of beta silicon carbide epitaxially deposited on a substrate. The substrate is readily fabricated as relatively large single crystals having surfaces suitable for epitaxial deposition of silicon carbide, so that the lateral dimensions of the epitaxial silicon carbide single crystal overlay may be as great as the lateral dimensions of the single crystal substrate. The substrate itself is thermally stable and does not adversely influence the desirable properties of the silicon carbide overlay. The silicon carbide/substrate device wafer base may be fabricated by known fabrication technologies. Devices may then be fabricated into the silicon carbide by using epitaxial growth and dry etch techniques. Utilization of the device wafer base and process of the present invention therefore permits the development of a successful and reproducible beta silicon carbide technology, which has important benefits at high temperatures, in adverse operating environments, such as those involving radiation or corrosion, and in high power, and high frequency devices.

In accordance with the invention, the substrate, upon which the epitaxial layer of beta silicon carbide is deposited, is titanium carbide. In particular, the semiconductor device base comprises a titanium carbide substrate and a beta silicon carbide overlay layer epitaxially related to the substrate, the overlay layer being unpolytyped, single crystal, uncracked, without twin imperfections, and having integrated circuit quality surface morphology. Although titanium carbide is the most preferred substrate, zirconium carbide, tungsten carbide, tantalum carbide, or scandium nitride may be substituted for the titanium carbide substrate material. Both the substrate and the beta silicon carbide overlay layer may be doped, as by ion implantation, to achieve regions of different electronic properties within the overlay layer.

The semiconductor device base may be prepared by furnishing a substrate of single crystal titanium carbide (or other substrate material identified previously), and depositing a layer of silicon carbide onto the substrate, so that the layer is a single crystal, is epitaxially related to the substrate, and is unpolytyped. Reactive deposition at a temperature of greater than about 1250° C., and preferably above about 1325° C., may be used to epitaxially deposit a beta silicon carbide overlay layer onto a titanium carbide substrate. In such a process, the proper substrate is placed into a vacuum chamber and pumped down, and then a flow of carbon-containing gas is established over the substrate. Silicon is evaporated from a source within the chamber, so that the evaporated silicon atoms pass through the carbon-containing gas and react therewith, and the resulting reaction products are deposited as an epitaxial layer on the substrate. The preferred carbon-containing gas is acetylene, although other such gases may also be used. In an alternative chemical vapor deposition approach, a silicon-containing gas and a carbon-containing gas may be reacted together over a substrate, with the silicon carbide reaction product being deposited as an epitaxial layer of beta silicon carbide onto the substrate.

As will now be appreciated, the device base and process for its preparation permit the development of an entirely new semiconductor technology based upon beta silicon carbide. The device base utilizing beta silicon carbide technology allows the development of devices for use at elevated temperatures, in high power and high frequency applications, and in many types of adverse environments. The device base itself is fabricated using conventional semiconductor technologies such as reactive deposition or chemical vapor deposition of the beta silicon carbide on the appropriate substrate. These advantages are achieved by selecting the proper substrate material meeting the criteria to be set forth below. Other features and advantages of the invention will become apparent from the following more detailed description, taken in conjunction with the accompanying drawings, which illustrate, by way of example, the principles of the invention.

DETAILED DESCRIPTION OF THE PREFERRED EMBODIMENT

Figure 1:
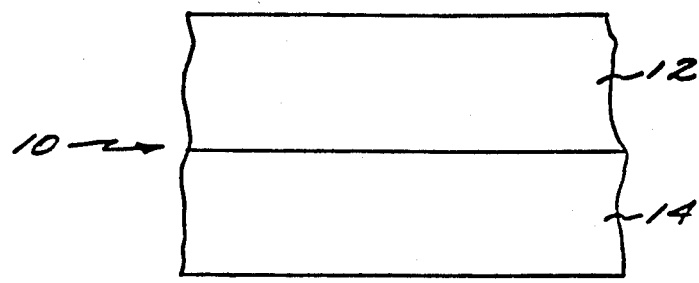
FIG. 1 is an elevational view of a device wafer base in accordance with the present invention.

Beta silicon carbide inherently possesses many of the characteristics most desirable in a high temperature semiconductor material. It has a large band gap, high breakdown voltage, excellent thermal conductivity, and may be doped by the same species used to dope silicon, to achieve similar results. It is chemically stable as the beta silicon polytype to about 2000° C., as compared with silicon, which has a melting point of about 1420° C. Beta silicon carbide is highly resistant to diffusional treatments and to diffusional alterations by foreign atoms. Beta silicon carbide is chemically inert to many reactants which can severely attack silicon and other common semiconductor materials. Ohmic contacts may be readily made to beta silicon carbide by the same techniques well known in the field of silicon semiconductor technology.

Silicon carbide may exist in numerous polytypes, or crystallographic variations of a single composition, which is a potential obstacle in utilizing silicon carbide in semiconductor device structures. An unintended conversion from one polytype to another during use could significantly alter the semiconductor device characteristics in some unpredictable and uncontrollable fashion. Even if the device were not in operation, crystallographic changes between polytypes during heating or cooling result in variable band gaps, and also can result in transformational strains and defect structures such as twins, which in themselves adversely affect the performance of the semiconductor device. Thus, the technique by which the silicon carbide is utilized must ensure that polytype stability of the silicon carbide is achieved, and most preferably the beta silicon carbide polytype having a cubic zincblend structure would be maintained as the stable polytype. Beta silicon carbide has a room temperature band gap of about 2.3 electron volts, while some of the hexagonal crystal structure, alpha silicon carbide polytypes have band gaps ranging to greater than 3 electron volts. The presence of small amounts of the alpha polytype in a beta silicon carbide crystal has a significant adverse effect on its semiconductor performance.

In accordance with the invention, a substrate of titanium carbide was chosen so that an epitaxial layer of beta silicon carbide could be deposited on the substrate at an elevated temperature, and then the composite could be cooled to ambient temperature with the epitaxial overlay layer in lateral compression. The substrate must have a lattice parameter within about 5% of that of beta silicon carbide at ambient temperature. It must have a sufficiently high melting or dissociation temperature, should be congruently melting, if a compound, and preferably have a high thermal conductivity. Finally, the substrate must be thermally stable, and relatively chemically inert so that a device structure is not destroyed through physical or chemical instability of the substrate. Thus, the present approach utilizes the epitaxial growth of silicon carbide on a lattice-matching substrate to achieve an epitaxial layer of beta silicon carbide having sufficient lateral dimensions to allow fabrication of device structures thereupon. Of course, the chosen substrate material must be capable of fabrication in sufficiently large single crystals that such a laterally extensive beta silicon carbide single crystal overlay layer is possible.

More specifically, the substrate was chosen to have a cubic crystal structure to match that of the beta silicon carbide polytype. Candidate materials were screened to have an ambient temperature lattice parameter mismatch to beta silicon carbide of less than about 5%, which is believed to be a maximum mismatch for achieving an epitaxial relationship between the substrate and the overlay layer. Candidate materials were also required to have physical and chemical stability to high temperatures, at least about 1500° C. That is, the candidate substrate materials were required to have melting or dissociation temperatures of greater than about 1500° C., and also to undergo no significant phase, polytype, or crystallographic transformations from ambient temperature to this upper limit.

Candidate substrate materials are required to have a coefficient of thermal expansion equal to or greater than that of beta silicon carbide. This relationship of thermal expansion coefficient allows the composite of an overlay and substrate to be fabricated at elevated temperatures, and then to be cooled to ambient temperature with the overlay layer in mild lateral compression. The lateral compressive stress state in the overlay layer prevents the formation of microcracks. The candidate substrate material also preferably has a high thermal conductivity, so as to provide a good thermal sink for extraction of heat from the beta silicon carbide during device operation. Finally, the candidate substrate materials should be capable of fabrication as single crystals having sufficiently large lateral dimensions that a beta silicon carbide overlay layer of desirably large lateral extent may be epitaxially deposited upon the single crystal. In this aspect of the screening, it was recognized that compounds must exhibit congruent melting to allow the growth of single crystals readily. Compounds which do not melt congruently may possibly be grown as large single crystals, but such growth is more difficult and more likely to produce composition or crystallographic fluctuations.

Based on these criteria, selected substrate materials include titanium carbide, zirconium carbide, tungsten carbide, scandium nitride, and tantalum carbide. Of this group, titanium carbide was chosen as the preferred substrate material, because of its very small lattice parameter mismatch with beta silicon carbide and the availability of titanium carbide single crystals.

The melting point of titanium carbide is about 3140° C., which is greater than the decomposition temperature of beta silicon carbide. The free energy of formation of titanium carbide is more negative than that of silicon carbide at all temperatures, and titanium carbide is therefore expected to be more stable. The titanium-carbon phase diagram indicates that titanium carbide (TiC), which has a range of solid solubility, is congruently melting at a carbon-to-titanium atomic ratio of about 0.8–1.0. One inch diameter, single crystal ingots with uniform composition may be prepared at a carbon-to-titanium atomic ratio of from about 0.8 to about 1.0 by the floating zone technique. See Yajima, Tenaka, Bannai and Kawai, "Preparation of $TiC_x$ Single Crystal with Homogeneous Compositions," *Journal of Crystal Growth*, Volume 47, pages 493–500 (1979). The thermal expansion coefficient of titanium carbide and beta silicon carbide both increase with increasing temperature, but the coefficient for titanium carbide is always approximately one and one-half times that for beta silicon carbide. The thermal conductivity of titanium carbide is less than that of beta silicon carbide, but sufficiently close to avoid large heat buildup in the beta silicon carbide. The lattice parameter mismatch between titanium carbide and beta silicon carbide is about 0.7%, well within the expected limits of epitaxial single crystal growth requirements.

Titanium carbide single crystals ingots were sawed with a water cooled diamond saw into substrate wafers having a thickness of about 1 millimeter, with a crystallographic orientation in the broad plane used for epitaxial deposition of about (100) (cubic Miller indices). One broad face of each substrate wafer was polished for thirty seconds on a belt polishing wheel using a polishing solution consisting of 45 grams of potassium ferricyanide, 1 gram of potassium hydroxide, 200 cubic centimeters of water and 0.5 grams of 0.05 micrometer alumina powder. During the polishing procedure, sufficient heat was generated to induce a chemical reaction between the titanium carbide, the potassium ferricyanide and the potassium hydroxide. This reaction resulted in the formation of a titanium oxide which was removed by the aluminum oxide polishing powder. The resulting titanium carbide substrate surface had a bright silver, mirrorlike appearance, appeared to be free of contaminants and oxides, and had a crystallographic orientation of about (100).

Figure 2:
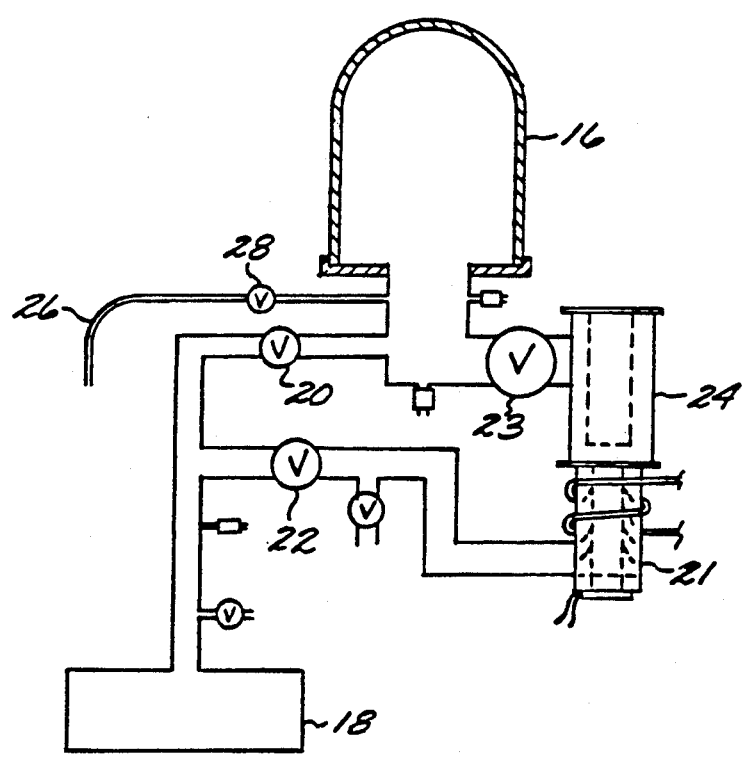
FIG. 2 is a schematic side sectional view of a reactive evaporation apparatus for preparing the device wafer base of FIG. 1.
Figure 3:
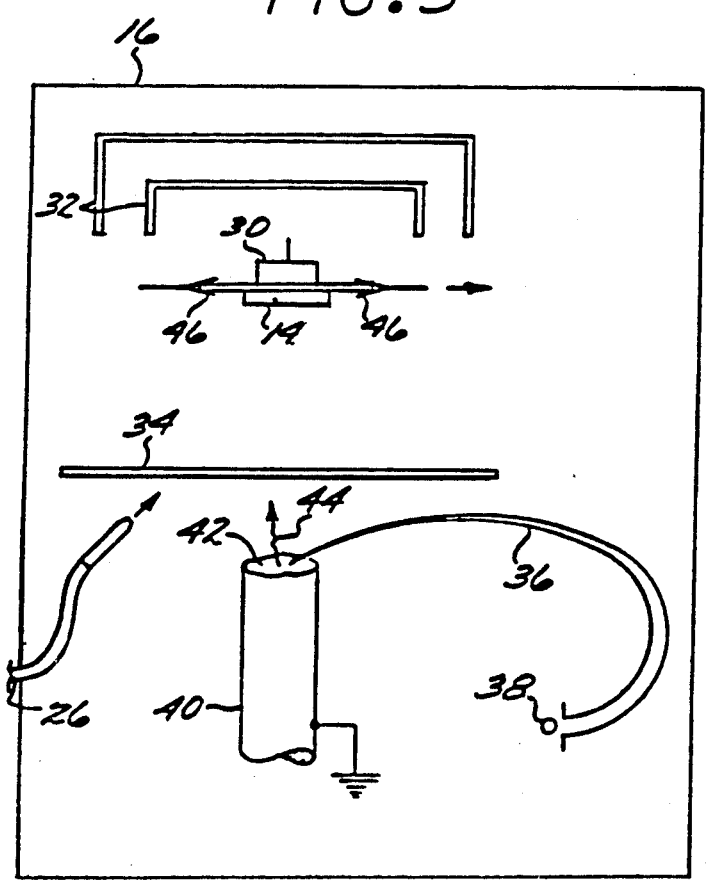
FIG. 3 is a schematic illustration of the hardware components in the vacuum chamber illustrated in FIG. 2.

A thin film of beta silicon carbide was then epitaxially deposited upon the prepared titanium carbide substrate. FIG. 1 illustrates a semiconductor device wafer base 10 having a silicon carbide overlay layer 12 epitaxially related to a titanium carbide substrate 14. As used herein, the term "device wafer base" refers to a composite structure which itself is not a semiconductor device, but may be further fabricated into a useful semiconductor device structure. FIGS. 2 and 3 illustrate a reactive evaporation approach for depositing the silicon carbide overlay layer 12 onto the titanium carbide substrate 14. FIG. 2 shows the general apparatus arrangement, while FIG. 3 presents a schematic detail of the components within the vacuum chamber of FIG. 2. Referring to FIG. 2, the reactive evaporation was conducted in a vacuum chamber 16, which was initially evacuated to a vacuum of about $10^{-6}$ torr. The vacuum chamber 16 was first roughed out with a mechanical vacuum pump 18. A roughing valve 20 was closed, and the mechanical pump 18 valved to communicate with a diffusion pump 21 by opening a backing valve 22. The roughing valve 20 was closed and the backing valve 22 opened when the pressure in the vacuum chamber 16 was less than about 200 micrometers. The diffusion pump 21 pumped the vacuum chamber through a gate valve 23 and through a liquid nitrogen cold trap 24. Conventional vacuum procedures were utilized, including baking of the vacuum chamber 16 prior to and during pumping. The vacuum chamber 16 also had provision for the introduction of a reactive gas through a bleed line 26 operating through a bleed valve 28.

FIG. 3 illustrates the relationship of the components within the vacuum chamber 16. Prior to loading into the vacuum chamber 16, the substrate 14 was degreased in acetone with an alcohol rinse and air dried. Immediately prior to being loaded into the vacuum chamber, the substrate was lightly etched in dilute hydrofluoric acid. The substrate 14 was placed into a holder 30 within the vacuum chamber 16, and was surrounded on its sides and back by molybdenum heat shields 32. In this position, the substrate 14 was separated from the evaporation source by a shutter 34, which was maintained closed until a steady state deposition condition was reached.

To evaporate silicon, an electron beam 36 from an electron beam gun 38 was directed against a grounded silicon ingot 40 which served as a feed stock. The electrons impinging upon the end of the ingot 40 heated the silicon and created a molten pool 42 thereupon, and silicon atoms 44 were ejected from the surface of the molten pool 42.

Once the flow of silicon atoms was established, the bleed valve 28 was opened to admit the reactive carbon-containing gas into the vacuum chamber 16. The preferred gas is acetylene ($C_2H_2$), which readily decomposes at the substrate temperature to yield free carbon. The pressure of the acetylene gas was not critical, and can typically vary from about $10^{-3}$ to about $10^{-6}$ torr. The evaporating silicon atoms 44 react with the carbon produced by the acetylene gas molecules to yield a reaction product which deposits upon the shutter 34 as silicon carbide. Once the silicon carbide deposition parameters were established, the shutter 34 was opened to allow deposition of the reaction products onto the substrate 14 to produce the overlay layer 12.

Prior to evaporation and deposition, the uncoated substrate 14 was heated, by the passage of an electrical current through the substrate 14, the current being supplied through a pair of leads 46 contacting the substrate 14. The preheat temperature may be measured and can be controlled by varying the current through the substrate 14. As will be described, deposition has been accomplished over a range of substrate temperatures from about 1000° C. to about 1600° C., with the structure of the device wafer base 10 being dependent upon the selected substrate temperature.

In a typical reactive evaporation deposition procedure, the electron beam current is not critical, but ranges from about 0.07 to about 0.15 amps. No processing or other limitations are known that would restrict the thickness of the overlay layer 12 to any particular value, but a preferred thickness is from about 0.1 to about 100 micrometers.

The following Table 1 lists the growth parameters and describes the results for a number of reactive evaporation runs:

TABLE 1

| GROWTH RUN | SUBSTRATE PREHEAT $T_S$(°C.) (min) | GROWTH TEMPERATURE $T_g$(°C.) | ELECTRON BEAM CURRENT I (AMPS) | ACETYLENE PRESSURE P (Torr) | GROWTH TIME $t_g$ (min) | COMMENTS |
|---|---|---|---|---|---|---|
| 1 | 750/5 | 1000 | ? | $1 \times 10^{-6}$ | 45 | MATT BLACK WITH CLEAR YELLOW RING |
| 2 | 800/50 | 1100 | 0.15 | $1 \times 10^{-6}$ | 30 | MATT SILVER |
| 3 | 850/5 | 900 | 0.13 | $4 \times 10^{-5}$ | 30 | MATT SILVER |
| 4 | 900/30 | 1050 | 0.10 | $1 \times 10^{-5}$ | 30 | SHINNY, BLUE YELLOW |
| 5 | 1192/15 | 950 | 0.08 | $1 \times 10^{-4}$ | 31 | MATT PURPLE |
| 6 | 1380/15 | 1385 | 0.07 | $1 \times 10^{-5}$ | 30 | CLEAR |
| 7 | 1320/10 | 1320 | 0.07 | $2 \times 10^{-5}$ | 30 | CLEAR |
| 8 | 1250/10 | 1251 | 0.07 | $1 \times 10^{-5}$ | 30 | YELLOWISH, CLEAR FILM W/HILLOCKS |
| 9 | 1250/10 | -SAMPLE SHIFTED AND RUN ABORTED- | | | | MATT GRAY DEPOSIT ON ONE EDGE |
| 10 | 1200/10 | 1200 | 0.07 | $1 \times 10^{-5}$ | 50 | MATT SILVER BROWNISH-YELLOW |
| 11 | 1190/15 | 1050 | 0.08 | $1 \times 10^{-5}$ | 45 | MATT SILVER BROWNISH-YELLOW |
| 12 | 1190/10 | 1190 | 0.06 | $1 \times 10^{-5}$ | 45 | SHINY BLUEISH YELLOW |
| 13 | 1500/5 | 1500 | 0.10 | $2 \times 10^{-5}$ | 45 | CLEAR |
| 14 | 1510/5 | 1512 | 0.14 | $6 \times 10^{-5}$ | 45 | CLEAR |
| 15 | 1500/5 | 1050 | 0.08 | $5 \times 10^{-5}$ | 6 | MATT SILVER |
| 16 | 1475/10 | 1475 | 0.13 | $7 \times 10^{-5}$ | 60 | CLEAR |
| 17 | 1500/15 | 1400 | 0.10 | $8 \times 10^{-5}$ | 60 | YELLOWISH |
| 18 | 1550/15 | 1382 | 0.13 | $2 \times 10^{-4}$ | 60 | CLEAR |
| 19 | 1550/2 | 1290 | 0.13 | $5.0 \times 10^{-4}$ | 60 | MATT SILVER |
| 20 | 1550/2 | 1362 | 0.14 | $1.0 \times 10^{-3}$ | 60 | CLEAR |
| 21 | 1550/30 | 1365 | 0.15 | $2.0 \times 10^{-3}$ | 60 | CLEAR |
| 22 | 1550/30 | 1350 | 0.15 | $1.3 \times 10^{-3}$ | 60 | CLEAR |

TABLE 1-continued

| GROWTH RUN | SUBSTRATE PREHEAT $T_S$(°C.) (min) | GROWTH TEMPERATURE $T_g$(°C.) | ELECTRON BEAM CURRENT 1 (AMPS) | ACETYLENE PRESSURE P (Torr) | GROWTH TIME $t_g$ (min) | COMMENTS |
|---|---|---|---|---|---|---|
| 23 | 1500/30 | 1350 | 0.15 | $2.0 \times 10^{-3}$ | 13 | MATT GRAY |
| 24 | 1510/30 | 1350 | 0.14 | $1.0 \times 10^{-3}$ | 50 | MATT SILVER |
| 25 | 1600/30 | 1345 | 0.14 | $1.5 \times 10^{-3}$ | 60 | CLEAR |
| 26 | 1580/30 | 1395 | 0.17 | $1.3 \times 10^{-3}$ | 22 | SPECULAR BLUISH BROWN |
| 27 | 1570/30 | 1385 | 0.11 | $1.5 \times 10^{-3}$ | 60 | CLEAR |
| 28 | 1575/30 | 1355 | 0.16 | $2.0 \times 10^{-3}$ | 49 | SPECULAR, YELLOW-BROWN |
| 29 | 1550/30 | 1335 | 0.22 | $1.5 \times 10^{-3}$ | 90 | SPECULAR, YELLOW-BROWN |
| 30 | 1575/30 | 1360 | 0.13 | $1.4 \times 10^{-3}$ | 180 | CLEAR |
| 31 | 1570/30 | 1315 | 0.09 | $1.5 \times 10^{-3}$ | 120 | HAZE BLUE |
| 32 | 1335/10 | 1320 | 0.07 | $1.5 \times 10^{-3}$ | 110 | CLEAR-YELLOWISH |
| 33 | 1330/10 | 1330 | 0.07 | $2.0 \times 10^{-3}$ | 60 | CLEAR-YELLOWISH |
| 34 | 1312/10 | 1326 | 0.07 | $1.7 \times 10^{-3}$ | 72 | CLEAR-YELLOWISH |
| 35 | 1307/10 | 1315 | 0.07 | $2.0 \times 10^{-3}$ | 90 | CLEAR-YELLOWISH |
| 36 | 1300/10 | | | -SAMPLE BROKEN DURING RUN- | | |

After fabrication, the device wafer bases 10 were evaluated by a number of techniques. Scanning electron microscopy and electron channeling contrast patterns revealed that the beta silicon carbide overlay layer 12 achieved an epitaxial relationship to the substrate 14 at substrate deposition temperatures of greater than about 1250° C. Silicon carbide surface smoothness of acceptable integrated circuit device quality was obtained at substrate growth temperatures greater than about 1325° C., and at or above about 1400° C. the silicon carbide has an excellent surface morphology. The most preferred substrate temperature is therefore about 1400° C., as higher temperatures increase the likelihood of silicon carbide polytype formation. At temperatures below about 1250° C., grains in the overlay layer 12 were observed. At all temperatures, the overlay layer 12 was unpolytyped, pure beta silicon carbide. Hexagonal polytypes were not present in the overlay layer 12. The device wafer base 10 was substantially free of defects such as twins, and was not cracked or otherwise physically damaged. The upper surface of the beta silicon carbide was smooth, and of integrated circuit quality and morphology. Surface morphology is critical to the successful, repeatable fabrication of devices in a crystal. The surface morphology of beta silicon carbide grown on carburized silicon is sometimes so irregular that devices cannot be fabricated, but the beta silicon carbide crystals prepared by the present invention exhibited excellent surface quality.

The fabricated films were measured and further processed in several ways to determine their basic electrical characteristics. Cold probe measurements indicated that all films were N-type with current readings in the range of $30-100 \times 10^{-9}$ amps.

Current-voltage measurements were performed in three ways. In the first, two point contacts to the titanium carbide substrate were made, these measurements resulting in non-rectifying I-V curves. In the second, one point contact was made to the titanium carbide substrate and a silver second contact having an area of about $7.3 \times 10^{-4}$ square centimeters was made to the beta silicon carbide film. This measurement resulted in diode type rectification, wherein a soft breakdown was observe at a reverse bias of approximately 25 volts. In the third measurement, two silver contacts each having an area of about $7.3 \times 10^{-4}$ square centimeters were made to the beta silicon carbide film. In each case, the resulting I-V curve was characteristic of back-to-back Schottky diodes, having a soft breakdown at approximately 25 volts.

In another procedure, titanium ions were implanted into the overlay layer 12, and then the implanted device wafer base 10 was annealed to assess its stability. $Ti^{+4}$ ions were implanted at an energy of about 125 KeV at a dose of $10^{-14}$ ions per square centimeter. The concentration of the titanium ions in the overlay layer 12 was assessed by secondary ion mass spectroscopy of sputtered layers. Samples of the implanted material were placed into a vacuum chamber and heated to a temperature of about 500° C. for a period of about one month, to assess the stability of the diffusion couple and the movement of the titanium atoms. Analysis of the samples prior to annealing revealed a sharp interface between the titanium carbide and the beta silicon carbide in the diffusion couple. No interface contamination layer was detected. After the one month annealing treatment, the interface was found to be substantially unchanged, but the implanted titanium ion distribution was found to have been altered. The beta silicon carbide overlay layer 12 had been severely damaged during the ion implantation process, and no attempt had been made to stabilize the titanium distribution in place prior to the annealing treatment. The relative stability of the device wafer base 10 after the one month annealing treatment indicates that the device base may be made sufficiently stable to be operable over long periods of time, at elevated temperatures, when further fabricated into a device structure.

Figure 4:
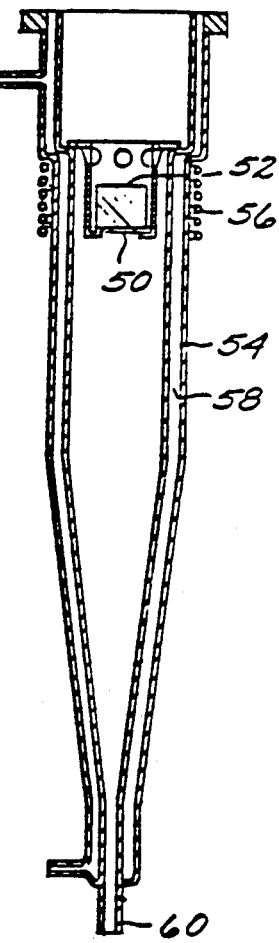
FIG. 4 is a side sectional view of a chemical vapor deposition apparatus for preparing the device wafer base of FIG. 1.

Chemical vapor deposition (CVD) was also used to fabricate device wafer bases 10. As illustrated in FIG. 4, a titanium carbide (100) single crystal substrate 50 was attached to a graphite susceptor 52, and placed into a chamber 54 within an RF heater coil 56, whereby the substrate 50 was heated to the deposition temperature as the susceptor 52 was heated. The chamber 54 was of a vertical double walled construction, so that cooling water could be passed through the outer jacket 58. A reactive gas having a source of carbon and a source of silicon was then introduced through a port 60 at the lower end of the chamber 54 and contacted to the substrate, so that a silicon carbide overlay layer was epitaxially deposited upon the titanium carbide substrate 50 as a result of a chemical reaction at the surface of the substrate. The preferred reactive gas included silane ($SiH_4$) as a source of silicon, n-hexane ($C_6H_{14}$) as a source of carbon, and hydrogen as a carrier. Typical reaction conditions were gas flow rates of 0.6 cubic centimeters per minute silane, 1.0 cubic centimeters per minute n-hexane, and 1500 cubic centimeters per minute hydrogen. The acceptable substrate temperature ranges are the same as described previously, with a typical substrate temperature of about 1390° C. The resulting overlay layers were unpolytyped single crystal beta silicon carbide, without cracks (including microcracks), free of twins, and of integrated circuit quality surface morphology. Many other combinations of reactive gases are known as sources of silicon and carbon, and the present invention is thought to be operable with such combinations.

As will now be appreciated, the device wafer base and process of the present invention offer significant advantages in the preparation of semiconductor devices. By properly selecting a substrate material, it is possible to fabricate epitaxially an overlay layer of beta silicon carbide having laterally extensive single crystal areas suitable for fabrication into semiconductor devices. The beta silicon carbide overlay layer is substantially free of detects such as twins, and is maintained in compression so as to avoid formation of microcracks or other physical defects. The device wafer base is also chemically and physically stable, and may be processed in a manner similar to that of silicon epitaxial structures. Although a particular embodiment of the invention has been described in detail for purposes of illustration, various modifications may be made without departing from the spirit and scope of the invention. Accordingly, the invention is not to be limited except as by the appended claims.

What is claimed is:

1. A semiconductor device wafer base, comprising:
a single crystal titanium carbide substrate; and
a beta silicon carbide overlay layer epitaxially related to said substrate, said overlay layer being unpolytyped, single crystals, uncracked, without twins, and of integrated circuit quality surface morphology.

2. The device wafer base of claim 1, wherein the thickness of said layer is about 0.1 to about 100 micrometers.

3. The device wafer base of claim 1, wherein said overlay layer is doped.

4. The device wafer base of claim 1, wherein said substrate is a single crystal.

5. The device wafer base of claim 1, wherein the crystallographic orientation of said overlay layer is the same as that of said substrate.

6. A semiconductor device wafer base, comprising:
a single crystal substrate having a cubic crystal structure with a lattice parameter at ambient temperature within about 5 percent of that of beta silicon carbide, a thermal expansion coefficient at least as great as that of beta silicon carbide, chemical and transformational stability, and congruent melting behavior; and
a beta silicon carbide overlay layer epitaxially related to said substrate, said overlay layer being unpolytyped, single crystal, uncracked, without twins, and of integrated circuit quality surface morphology;
said substrate being selected from the group consisting of titanium carbide, zirconium carbide, tungsten carbide, tantalum carbide, and scandium nitride.

7. The device wafer base of claim 6, wherein said substrate is titanium carbide.

8. The device wafer base of claim 6, wherein the surface crystallographic orientation of said substrate is (100).

* * * * *